US011289353B2

(12) United States Patent
Schaller et al.

(10) Patent No.: US 11,289,353 B2
(45) Date of Patent: Mar. 29, 2022

(54) HERMETICALLY SEALED HOUSING WITH A SEMICONDUCTOR COMPONENT AND METHOD FOR MANUFACTURING THEREOF

(71) Applicant: Infineon Technologies AG, Neubiberg (DE)

(72) Inventors: Rainer Markus Schaller, Saal a.d. Donau (DE); Horst Theuss, Wenzenbach (DE)

(73) Assignee: Infineon Technologies AG, Neubiberg (DE)

( * ) Notice: Subject to any disclaimer, the term of this patent is extended or adjusted under 35 U.S.C. 154(b) by 672 days.

(21) Appl. No.: 16/158,438

(22) Filed: Oct. 12, 2018

(65) Prior Publication Data
US 2019/0131154 A1 May 2, 2019

(30) Foreign Application Priority Data
Oct. 26, 2017 (DE) .......................... 102017125140.5

(51) Int. Cl.
*H01L 21/673* (2006.01)
*H01L 23/049* (2006.01)
*H01L 23/20* (2006.01)
*H01L 21/67* (2006.01)
*B81C 1/00* (2006.01)

(52) U.S. Cl.
CPC .... *H01L 21/67376* (2013.01); *B81C 1/00285* (2013.01); *H01L 21/67126* (2013.01);
(Continued)

(58) Field of Classification Search
CPC ............... H01L 21/67376; H01L 23/20; H01L 21/67393; H01L 21/67126; H01L 23/049;
(Continued)

(56) References Cited

U.S. PATENT DOCUMENTS

2004/0104643 A1* 6/2004 Kawauchi ................ H03H 9/21
310/344
2005/0194677 A1 9/2005 Heschel et al.
(Continued)

FOREIGN PATENT DOCUMENTS

DE 102005060870 6/2007
DE 102014202801 8/2015
DE 102015224482 6/2017

*Primary Examiner* — Mouloucoulaye Inoussa
(74) *Attorney, Agent, or Firm* — Harrity & Harrity, LLP

(57) ABSTRACT

A method is provided for producing a hermetically sealed housing having a semiconductor component. The method comprises introducing a housing having a housing body and a housing cover into a process chamber. The housing cover closes off a cavity of the housing body and is attached in a gas-tight manner to the housing body. At least one opening is formed in the housing. At least one semiconductor component is arranged in the cavity. The method furthermore comprises generating a vacuum in the cavity by evacuating the process chamber, and also generating a predetermined gas atmosphere in the cavity and the process chamber. The method moreover comprises applying sealing material to the at least one opening while the predetermined gas atmosphere prevails in the process chamber.

24 Claims, 5 Drawing Sheets

(52) U.S. Cl.
 CPC ...... *H01L 21/67393* (2013.01); *H01L 23/049* (2013.01); *H01L 23/20* (2013.01); *B81C 2203/0145* (2013.01)

(58) Field of Classification Search
 CPC ....... H01L 25/50; H01L 25/072; H01L 21/50; H01L 23/3735; H01L 24/75; H01L 21/566; H01L 24/83; H01L 23/02; H01L 23/10; B81C 1/00285; B32B 37/10; B81B 7/0038; B81B 7/02
 USPC .......... 438/121, 15, 455; 257/687, 704, 779, 257/794, E27.137, E31.131; 310/344, 310/348, 455; 250/338.1, 332, 352, 250/370.01, 340
 See application file for complete search history.

(56) References Cited

U.S. PATENT DOCUMENTS

| | | | | |
|---|---|---|---|---|
| 2006/0244085 A1* | 11/2006 | Gore | ............ | B41J 2/16 257/414 |
| 2007/0182289 A1* | 8/2007 | Kigawa | ............ | H03H 9/1021 310/348 |
| 2007/0235501 A1* | 10/2007 | Heck | ............ | B81C 1/00293 228/101 |
| 2008/0042523 A1* | 2/2008 | Kuroda | ............ | H03H 9/0595 310/344 |
| 2008/0153258 A1* | 6/2008 | Thallner | ............ | H01L 21/67092 438/455 |
| 2009/0140146 A1* | 6/2009 | Sogawa | ............ | H01L 23/057 250/338.1 |
| 2009/0174148 A1 | 7/2009 | Bischof et al. | | |
| 2009/0195125 A1* | 8/2009 | Matsugi | ............ | H03H 9/1021 310/348 |
| 2011/0114840 A1* | 5/2011 | Yamazaki | ............ | G01J 5/045 250/338.1 |
| 2013/0203218 A1* | 8/2013 | Bayerer | ............ | H01L 25/50 438/121 |
| 2013/0243942 A1* | 9/2013 | Pornin | ............ | H01L 23/315 427/105 |
| 2015/0353346 A1* | 12/2015 | Heuck | ............ | B81B 7/02 257/415 |
| 2016/0368763 A1 | 12/2016 | Gonska et al. | | |
| 2017/0158497 A1 | 6/2017 | Breitling et al. | | |
| 2018/0095105 A1* | 4/2018 | Kawano | ............ | G01P 15/0802 |

* cited by examiner

HERMETICALLY SEALED HOUSING WITH A SEMICONDUCTOR COMPONENT AND METHOD FOR MANUFACTURING THEREOF

RELATED APPLICATION

This application claims priority under 35 U.S.C. § 119 to German Patent Application No. 102017125140.5, filed on Oct. 26, 2017 the content of which is incorporated by reference herein in its entirety.

TECHNICAL FIELD

Example embodiments relate to a hermetically sealed housing having a semiconductor component and also to methods for the production thereof.

BACKGROUND

Hermetically sealed housings are used for a multiplicity of applications which require a defined gas atmosphere. In this case, a housing is ordinarily sealed with a cover. This can be effected, for example, by means of welding, soldering, or glass frit bonding. All of these processes require a high temperature, however. In addition, the sealing processes have to be carried out under that gas atmosphere which should prevail later within the housing. However, on account of the cooling to room temperature after the sealing process, the gas pressure drops to a fraction of the ambient pressure which prevails during the attachment of the cover (e.g. 50%). In other words: the actual gas pressure of the gas atmosphere within the housing is only at a fraction of the desired or required gas pressure.

SUMMARY

There is therefore a need to provide an improved production method for hermetically sealed housings.

The need can be covered by the subject matter of the patent claims.

Example embodiments of a method for producing a hermetically sealed housing having a semiconductor component comprise introducing a housing having a housing body and a housing cover into a process chamber. The housing may be a semiconductor package to hermetically seal the semiconductor component. The housing cover closes off a cavity of the housing body and is attached in a gas-tight manner to the housing body. At least one opening is formed in the housing. At least one semiconductor component (e.g. at least one semiconductor chip) is arranged in the cavity. The housing may fully encompass the semiconductor chip. The housing (housing body and housing cover) may therefore not be formed by parts of the semiconductor chip. The housing body and housing cover may be preformed separately to the semiconductor chip. The method furthermore comprises generating a vacuum in the cavity by evacuating the process chamber, and also generating a predetermined gas atmosphere in the cavity and the process chamber. The method moreover comprises applying sealing material to the at least one opening while the predetermined gas atmosphere prevails in the process chamber.

Furthermore, example embodiments relate to a further method for producing a hermetically sealed housing having a semiconductor component. The method comprises introducing a housing having a housing body and a housing cover into a process chamber. The housing cover closes off a cavity of the housing body and is attached in a gas-tight manner to the housing body. At least one opening is formed in the housing. At least one semiconductor component is arranged in the cavity. Furthermore, the method comprises generating a vacuum in the cavity by evacuating the process chamber, and also generating a predetermined gas atmosphere in the cavity and the process chamber. The method moreover comprises introducing sealing material into the at least one opening while the predetermined gas atmosphere prevails in the process chamber. Furthermore, the method comprises melting the sealing material, such that the molten sealing material closes the at least one opening in a gas-tight manner.

Example embodiments moreover relate to yet another method for producing a hermetically sealed housing having a semiconductor component. The method comprises providing a housing having a housing body and a housing cover. The housing cover closes off a cavity of the housing body and is attached in a gas-tight manner to the housing body. At least two openings are formed in the housing. At least one semiconductor component is arranged in the cavity. The method furthermore comprises guiding a gas flow through the cavity by means of the at least two openings, such that a predetermined gas atmosphere is formed in the cavity. Furthermore, the method comprises applying sealing material to the at least two openings, and also closing the at least two openings in a gas-tight manner by means of the sealing material.

Moreover, example embodiments also relate to a hermetically sealed housing, comprising a housing body and a housing cover. The housing cover closes off a cavity of the housing body and is attached in a gas-tight manner to the housing body. A predetermined gas atmosphere prevails in the cavity. An opening is formed in the housing, said opening being closed in a gas-tight manner by a molten sealing material. Furthermore, a semiconductor component is arranged in the cavity.

BRIEF DESCRIPTION OF THE DRAWINGS

A number of examples of apparatuses and/or methods will be explained in more detail hereinbelow, merely by way of example, with reference to the accompanying figures.

DETAILED DESCRIPTION

Various examples will now be described in more detail with reference to the accompanying figures, in which a number of examples are shown. In the figures, the thicknesses of lines, layers and/or regions may be exaggerated for illustration purposes.

While further examples are suitable for various modifications and alternative forms, a number of specific examples thereof are correspondingly shown in the figures and will be described in detail hereinbelow. However, this detailed description does not restrict further examples to the specific forms described. Further examples can cover all modifications, counterparts and alternatives that fall within the scope of the disclosure. Throughout the description of the figures, identical reference signs refer to identical or similar elements which can be implemented identically or in modified form in a comparison with one another, while they provide the same or a similar function.

Unless defined otherwise, all terms (including technical and scientific terms) are used here in their customary meaning in the field with which examples are associated.

Figure 1:
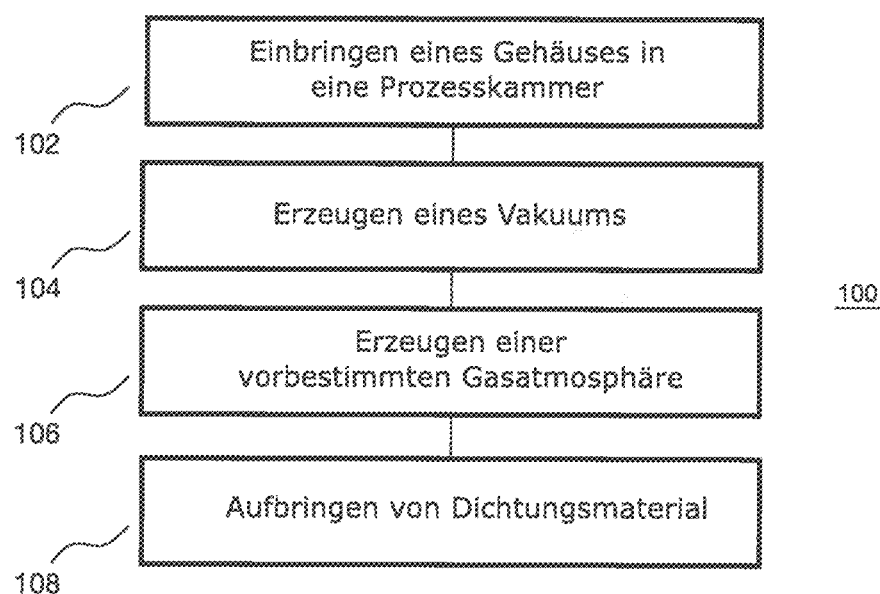
FIG. 1 shows a flow chart of an example embodiment of a method for producing a hermetically sealed housing having a semiconductor component.

FIG. 1 shows a first method 100 for producing a hermetically sealed housing having a semiconductor component. The method comprises introducing 102 a housing having a housing body and a housing cover into a process chamber.

The process chamber is a closed volume in which one or more (outer) process parameters can be set. By way of example, a specific temperature, a specific gas pressure or a specific gas atmosphere can be set in the process chamber.

Housing bodies, as well as housing covers, can be formed from a multiplicity of different materials. By way of example, the housing body can be formed from ceramic, whereas the housing cover can be formed from ceramic, metal, semi-metal (e.g. silicon), or glass. The housing cover closes off a cavity of the housing body and is attached in a gas-tight manner to the housing body. In other words: the housing cover is attached to the housing body in such a manner that essentially no gas exchange can take place between the cavity and the atmosphere surrounding the housing. It is self-evident here, however, that it is not always possible to attach the housing cover to the housing body with perfect sealing action on account of customary process-related fluctuations or tolerances. Accordingly, for the purposes of the present application, the term "gas-tight" also encompasses methods of fastening the housing cover to the housing body which allow for a certain (very small) leakage into the cavity or out of the latter. By way of example, the housing cover can be attached to the housing body by means of welding (e.g. seam welding, resistance welding or laser welding), soldering (with or without the use of preforming), or glass frit bonding.

At least one opening is formed in the housing. The opening may be any type of cutout in the housing which allows for contact of the cavity in the housing with the atmosphere surrounding the housing. The opening may be arranged both in the housing cover, the housing body, and also in the gas-tight attachment of the housing cover to the housing body. By way of example, the opening may be formed in a base plate of the housing body (which is adjoined by one or more side walls of the housing body). Along its extent through the housing, the opening may have any type of cross section. This cross section may be constant or may vary. By way of example, the cross section may taper along the extent of the opening through the housing. Similarly, the shape of the cross section may be any desired. By way of example, the cross section may be round, oval, angular or star-shaped.

Moreover, at least one semiconductor component is arranged in the cavity. The semiconductor component may be any component comprising a semiconductor material. By way of example, the semiconductor component may be a sensor, for instance a microphone (e.g. a MEMS, MicroElectroMechanical System), or a light source (e.g. for infrared or other light).

Furthermore, the method 100 comprises generating 104 a vacuum in the cavity by evacuating the process chamber. Since the cavity in the interior of the housing is in contact with the volume of the process chamber via the opening, the evacuation of the process chamber means that a vacuum can be generated in the cavity and thus gas located in the cavity at the start can be removed therefrom. By way of example, the process chamber may be coupled to one or more vacuum pumps, which pump away the gas located in the process chamber and thus generate the vacuum in the cavity of the housing. A vacuum is understood to mean a pressure of 300 mbar or less.

The method 100 furthermore comprises generating 106 a predetermined gas atmosphere in the cavity and the process chamber. The predetermined gas atmosphere contains one or more predetermined gaseous media at a predetermined temperature and a predetermined gas pressure. On account of the contact between the cavity in the interior of the housing and the volume of the process chamber via the opening, it is possible, by setting the predetermined gas atmosphere in the process chamber, for the gas atmosphere to also be set in the cavity. By way of example, the predetermined gas atmosphere may consist essentially (e.g. to an extent of more than 75, 80, 85, 90, 95, 99% by volume or more) of carbon monoxide, carbon dioxide, methane, ethanol, nitrogen, a halogen, or a combination thereof. A temperature of the predetermined gas atmosphere may be, e.g., between 15° C. and 30° C., while a hydrostatic pressure of the predetermined gas atmosphere may be between 0.5 bar and 3 bar.

The method 100 moreover comprises applying 108 sealing material to the at least one opening while the predetermined gas atmosphere prevails in the process chamber. The opening can be closed in a gas-tight manner by means of the sealing material. The sealing material may be any material suitable for closing the opening. If, by way of example, the opening is metallized (i.e. lined with a layer of metal or metal alloy), the sealing material may be a predetermined quantity of a metal alloy. The layer of metal or metal alloy may be formed on the surfaces of the opening (e.g. vertically) and locally around the opening on at least one surface of the housing. In some embodiments, the layer of metal or metal alloy may be formed locally around the opening on the external side of the housing. If the opening is not metallized, the sealing material may alternatively also be a predetermined quantity of glass, for example. In order to close the cavity in a gas-tight manner after the predetermined gas atmosphere has been set in the latter, merely the applying 108 of the sealing material to the opening is necessary in the method 100. Compared to the gas-tight attachment of the housing cover to the housing body, this can be effected with a considerably lower and also locally concentrated input of heat. Accordingly, heating of the gas atmosphere can essentially be avoided, and the desired pressure conditions with the housing can be maintained. In the case of a housing produced by the method 100, the actual gas pressure of the gas atmosphere within the housing can thus correspond substantially to the gas pressure of the gas atmosphere within the process chamber.

By way of example, the applying 108 of sealing material may comprise applying a viscous sealing material to the at least one opening. Here, viscous sealing material can be understood to mean any sealing material with a dynamic viscosity of 1000 PaS or less. By way of example, a solder paste can be applied (e.g. dispensed or printed on) to the opening.

Similarly, the applying 108 of sealing material may comprise spinning sealing material from a capillary onto the at least one opening. Such an ejection of the sealing material from a capillary onto the at least one opening may allow for the sealing material to be applied in a targeted manner and quickly.

After the spinning of the sealing material, the latter can furthermore also be melted (e.g. by means of a pulsed laser beam), such that the applying 108 of sealing material effectively comprises applying a sealing material in a molten state to the at least one opening. If the opening is metallized, the sealing material may be, for example, a ball formed from a metal alloy (e.g. from a solder). The ball is spun in a solid state (i.e. not melted) from the capillary onto the opening. Almost at the same time, the ball can be melted using, for example, a laser pulse. In this way, the molten ball wets the metallization of the opening and then is hardened again, since the sealing material is in a solid aggregate state at room temperature (i.e. between 15° C. and 30° C.). The opening is thus closed in a gas-tight manner.

Accordingly, after the applying 108 of the sealing material, it is possible to dispense with a further supply of heat into the housing or the sealing material for closing the at least one opening in a gas-tight manner. Instead, the melting is effected by the locally limited input of heat into the ball formed from the metal alloy. Therefore, it is not the entire housing that is exposed to elevated temperatures. Heating of the gas atmosphere and the associated change in the static pressure of the gas atmosphere in the cavity of the housing can thus be avoided.

In addition to spinning, the sealing material can also be applied to the at least one opening in a different way. By way of example, a ball formed from a metal alloy can be placed onto the opening and then locally heated (e.g. by means of a laser beam or a soldering tool), so that it melts quickly, wets the metallization of the opening, and thus closes the opening. It is self-evident that it is also possible to use other geometries in addition to the above-mentioned balls of a metal alloy—purely by way of example, a piece of solder wire is mentioned here.

While the predetermined gas atmosphere prevails in the process chamber, the method 100 can thus comprise melting of the sealing material, such that the molten sealing material closes the at least one opening in a gas-tight manner. As has already been indicated above, the melting of the sealing material can comprise heating merely a partial region of the housing, which surrounds the at least one opening, and also of the sealing material. By way of example, the melting of the sealing material can comprise irradiating the sealing material with a laser beam.

The sealing material is chosen here in such a way that its melting point is lower than the melting point of that part of the housing which surrounds the opening. In this way, melting of the housing during the melting of the sealing material can be avoided. It can thus be ensured that, during the melting of the sealing material, no further openings are formed in the housing by melting of the housing. In this case, the sealing material can be selected in such a manner, for example, that its melting point is above 200° C. If the housing produced by method 100 is reheated, for example in a later process (e.g. during the application of the housing to a printed circuit board, PCB), renewed melting of the sealing material during this subsequent process can be prevented.

In the method 100, the housing cover can thus be attached using standard processes and equipment without having to take into consideration process temperatures, pressures or ambient atmospheres which are involved. A higher pressure and therefore a higher gas concentration compared to conventional production methods can be achieved, since the sealing process (i.e. the sealing of the at least one opening) can be carried out substantially at room temperature with only a small increase in the local temperature (e.g. on account of the laser pulse).

By way of illustration, FIG. 2 once again shows individual process steps of an example embodiment of the method 100. For reasons of clarity, the illustration of the semiconductor component has been dispensed with here.

Firstly, the housing 200 together with the semiconductor component 260 is provided. The housing cover 220 of the housing 200 is attached in a "standard" manner, as described above. However, a small opening 240 (or more than one opening) remains—either in the housing cover 220, the housing body 210 or the connection between the housing body 210 and the housing cover 220. In the example shown in FIG. 2, the opening 240 is arranged in a base plate of the housing body 210. The opening 240 may be, for example, a metallized through hole (via hole), which can be produced using standard methods during the production of the cavity housing 200 (e.g. made of ceramic).

After the attachment of the housing cover 220, the housing 200 is introduced into a process chamber (vacuum chamber) 290, and the latter is then evacuated. Then, the vacuum chamber 290 is flooded with the required gas—this fills the evacuated cavity 211 through the via hole 240.

Then, the housing 200—i.e. the via hole 240—is sealed using a process which does not expose the entire housing 200 to elevated temperatures. This process is carried out entirely in the corresponding gas atmosphere in the process chamber 290. This can take place in a variety of ways, as already indicated above. By way of example, the metallized via hole 240 can be sealed by launching a solder ball 280, i.e. a ball made of a metal alloy suitable for soldering, onto the via hole 240 (the diameter of the solder ball 280 is greater than the diameter of the via hole 240). Almost at the same time, the solder ball 280 is melted using a laser pulse 270 (also referred to as solder jetting). The solder thus wets the metallization of the via hole 240, and is hardened again. The geometry and shape of the via metallization determine the final shape of the seal (on account of the surface tension of the liquid solder).

Alternatively, a solder ball may also be placed onto the via hole 240 in a different way and be locally heated (e.g. by a laser pulse or a small soldering tool), such that it melts quickly and wets and seals the via metal again.

Instead of a solder ball (sphere), it is also possible for other geometries to be used (e.g. a piece of solder wire). Instead of a solid solder, it is also possible for a certain volume of a solder paste to be applied (e.g. dispensed or printed on). The solder used for sealing the via hole 240 may have a melting temperature of higher than 260° C. (e.g. alloys of SnCuNi, AuSn, or solders which contain a high content of Pb). The solder therefore does not melt again during the attachment of the final housing 200 to a printed circuit board (PCB).

Alternatively, a glass solder (glass frit) can also be used in order to seal the opening 240. In this case, the opening 240 can be realized without a metallization.

The opening 240 does not have to be circular, but instead, for example, may also be a slot or may have any other geometry.

Figure 3:
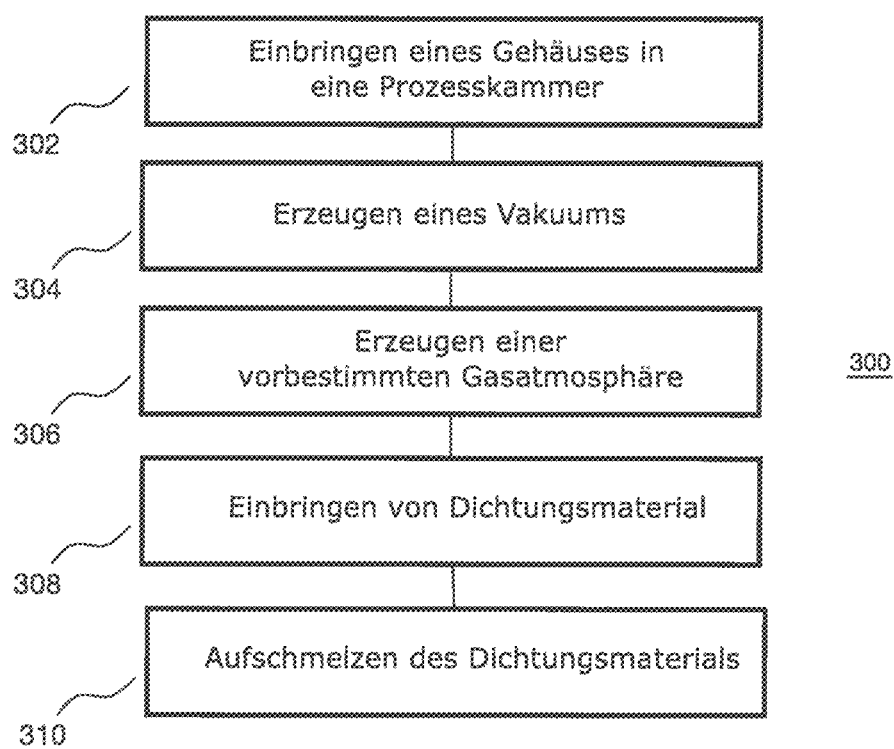
FIG. 3 shows a flow chart of a second example embodiment of a method for producing a hermetically sealed housing having a semiconductor component.

FIG. 3 furthermore shows yet another method 300 for producing a hermetically sealed housing having a semiconductor component. The method 300, too, comprises introducing 302 a housing having a housing body and a housing cover into a process chamber. The housing cover closes off a cavity of the housing body and is attached in a gas-tight manner to the housing body. At least one opening is formed in the housing. At least one semiconductor component is arranged in the cavity. Similarly, the method 300 comprises generating 304 a vacuum in the cavity by evacuating the process chamber, and also generating 306 a predetermined gas atmosphere in the cavity and the process chamber. Reference is therefore made to the above statements in relation to the corresponding process steps of the method 100.

The method 300 moreover comprises introducing 308 sealing material into the at least one opening while the predetermined gas atmosphere prevails in the process chamber. The introduction of sealing material into the opening makes it possible to achieve preliminary closure of the opening, such that the predetermined gas atmosphere prevailing in the cavity of the housing can be maintained at least for a short period of time irrespective of the atmosphere surrounding the housing.

Furthermore, the method 300 comprises melting 310 the sealing material, such that the molten sealing material closes the at least one opening in a gas-tight manner. In the method 300, the melting 310 of the sealing material can then take place under any desired atmosphere on account of the preliminary closure of the opening by the sealing material which has been introduced. By way of example, the melting 310 of the sealing material may be effected inside or outside the process chamber. Outside the process chamber, the melting of the sealing material may be effected, for example, under an air atmosphere (i.e. in the presence of customary ambient air around the housing).

The introducing 308 of the sealing material into the at least one opening may comprise, for example, pressing a solid body consisting of the sealing material into the at least one opening. The pressing-in of the solid body may allow for there to be a mechanical fit between the opening and the solid body, and this allows for preliminary sealing of the cavity with a high quality.

For better illustration, FIG. 4 once again shows individual process steps of an example embodiment of the method 300. For reasons of clarity, the illustration of the semiconductor component has again been dispensed with.

Figure 2:
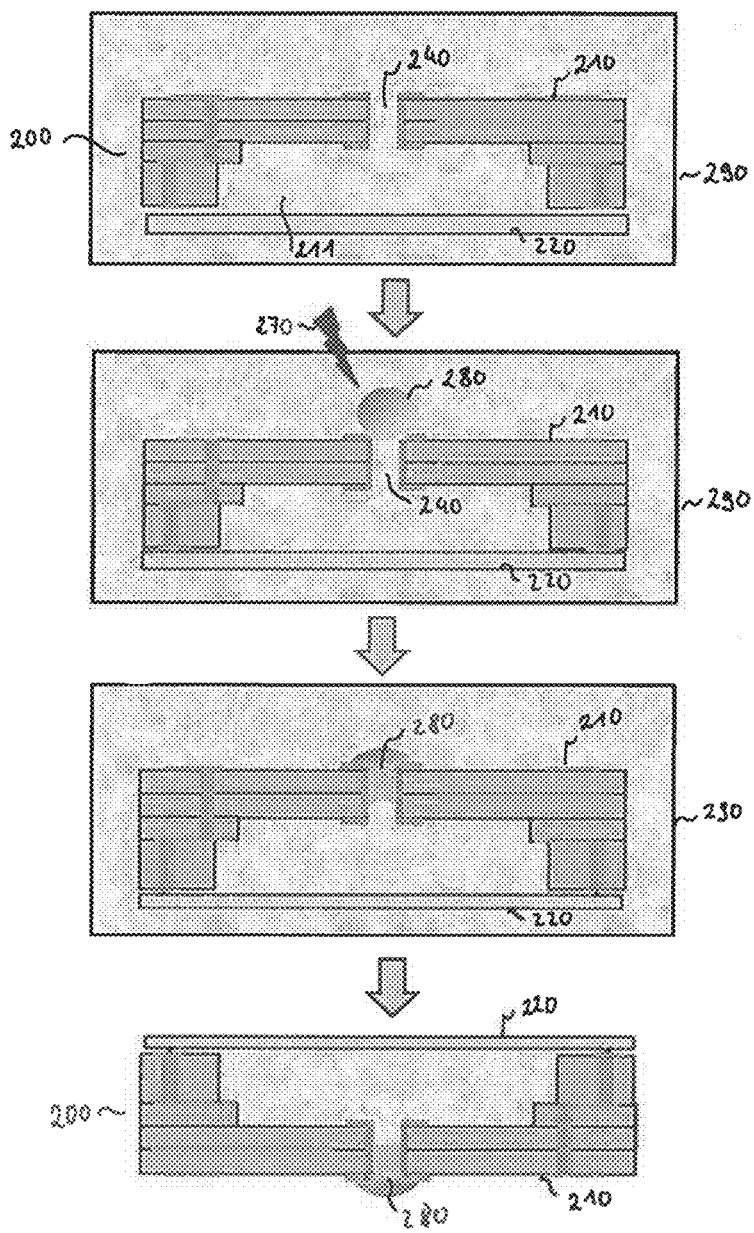
FIG. 2 shows individual process steps of the method for producing a hermetically sealed housing having a semiconductor component.

As already stated above in conjunction with FIGS. 1 and 2, firstly the housing 400 (with housing body 410 and housing cover 420) is introduced into the process chamber (vacuum chamber) 490, the latter is then evacuated, and the desired gas atmosphere is set.

After the cavity 411 has been filled with the selected gas, the via hole 440 is pre-sealed. Thereafter, it can be taken from the vacuum chamber 490, such that the final sealing (e.g. a laser process or local heating by a small soldering tool) can be carried out with little complexity under a standard ambient atmosphere (i.e. air). The pre-sealing can be effected by way of various process steps.

Figure 4:
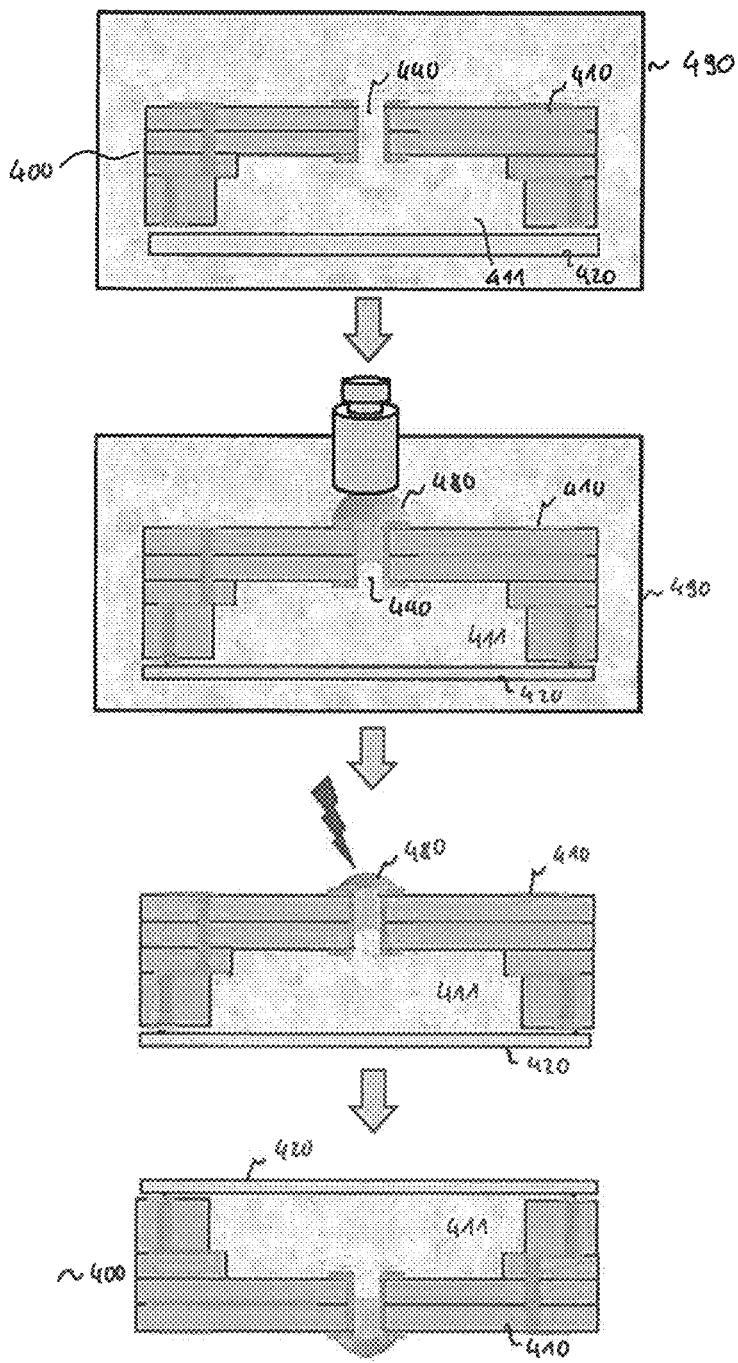
FIG. 4 shows individual process steps of the second method for producing a hermetically sealed housing having a semiconductor component.

By way of example, a solder ball 480 (or another piece of solder, i.e. a metal alloy) can be pressed mechanically into the via hole 440, as is shown in FIG. 4. Through the mechanically ductile deformation of the solder ball 480, the latter seals the hole 440 adequately for a certain time. By way of example, the solder ball 480 may be spun in turn from a capillary onto the opening 440.

Similarly, the pre-sealing may be achieved in the manner of a press fit by using a "plug". Then (e.g. outside the vacuum chamber 490), the sealing can be completed by a standard sealing process.

The complementation of the sealing may be effected as shown above, e.g. by way of melting the solder ball 480 by means of a (pulsed) laser beam or a corresponding soldering tool.

Alternatively, it is also possible again for a glass solder (glass frit) to be used in order to seal the opening 400. In this case, the opening 440 can be realized without a metallization.

Figure 5:
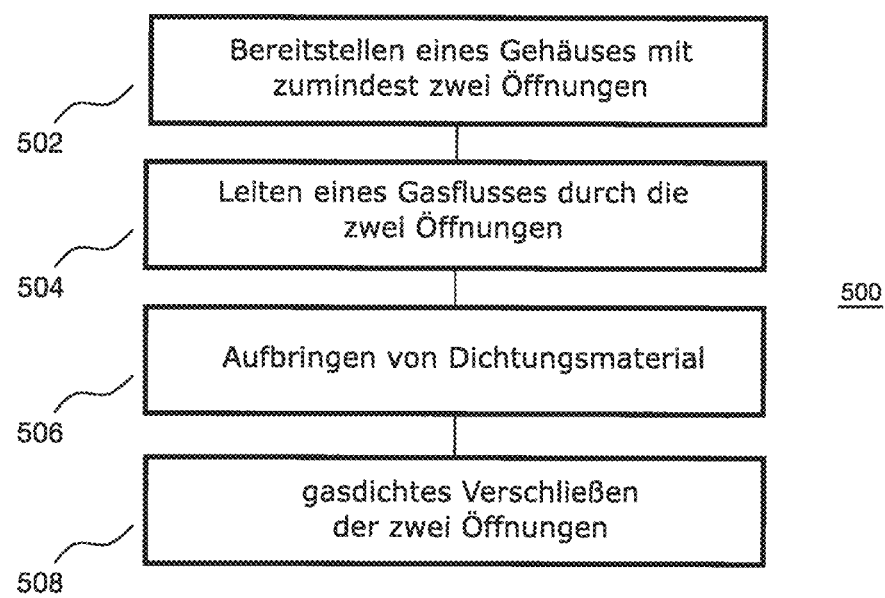
FIG. 5 shows a flow chart of a third example embodiment of a method for producing a hermetically sealed housing having a semiconductor component.

FIG. 5 shows a further alternative method 500 for producing a hermetically sealed housing having a semiconductor component. The method 500, too, comprises providing 502 a housing having a housing body and a housing cover. The housing cover in turn closes off a cavity of the housing body and is attached in a gas-tight manner to the housing body. It is also the case that at least one semiconductor component is again arranged in the cavity. In this respect, reference should be made to the above statements in relation to the housing and the semiconductor component. In contrast to the methods described above, at least two openings are formed in the housing, however, in the method 500.

The method 500 furthermore comprises guiding 504 a gas flow through the cavity by means of the at least two openings, such that a predetermined gas atmosphere is formed in the cavity. In this way, the predetermined gas atmosphere can be generated in the cavity of the housing without the need for the previous generation of a vacuum in the cavity.

Furthermore, the method 500 comprises applying 506 sealing material to the at least two openings, and also closing 508 the at least two openings in a gas-tight manner by means of the sealing material. The applying 506 of sealing material as well as the closing 508 of the at least two openings in a gas-tight manner may in turn be effected in accordance with the process steps described above for a single opening. In this respect, reference should be made to the above statements in connection with FIGS. 1 and 2. Thus, the closing 508 of the at least two openings in a gas-tight manner may comprise, for example, melting of the sealing material, such that the molten sealing material closes each of the at least two openings in a gas-tight manner. The melting of the sealing material in this case comprises heating merely a partial region of the housing, which surrounds one of the at least two openings, and also of the sealing material. Accordingly, it is possible to avoid a situation in which the entire housing is exposed to elevated temperatures and the gas atmosphere in the cavity of the housing heats up significantly.

As an alternative to the methods 100 and 200, the method 500 may therefore make it possible for the cavity to be filled with gas without previously employing a vacuum. Since at least two openings to the cavity are left after the cover has been attached, the gas filling can be achieved by blowing the gas required into one of the holes for a certain time, until the original gas in the interior of the housing has been displaced and has been replaced by the selected gas.

Figure 6:
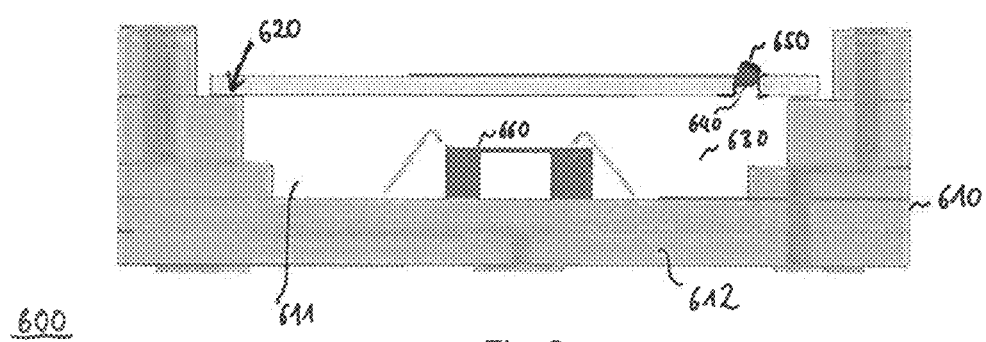
FIG. 6 shows an example embodiment of a hermetically sealed housing.

FIG. 6 furthermore also shows a hermetically sealed housing 600, as can be produced, for example, by one of the methods described above. The housing 600 comprises a housing body 610 and a housing cover 620. By way of example, the housing body 610 may be formed from ceramic, while the housing cover 620 may be formed from ceramic, metal or glass.

The housing cover 620 closes off a cavity 611 of the housing body 610 and is attached in a gas-tight manner to the housing body 610. The housing cover 620 is therefore attached to the housing body 610 in such a manner that essentially no gas exchange can take place between the cavity 611 and the atmosphere surrounding the housing 600. A predetermined gas atmosphere 630 prevails in the cavity 611. On account of the gas-tight attachment of the housing cover 620 to the housing body 610, it is possible to substantially avoid escape of the gas of the gas atmosphere 630 from the cavity 611 and also contamination of the gas atmosphere 630. By way of example, the predetermined gas atmosphere 630 may consist essentially (e.g. to an extent of more than 75, 80, 85, 90, 95, 99% by volume or more) of carbon monoxide, carbon dioxide, methane, ethanol, nitrogen, a halogen or a combination thereof.

Furthermore, a semiconductor component 660 is arranged in the cavity 611. The semiconductor component 660 may be any component which comprises a semiconductor material. As already indicated above, the semiconductor component 660 may be, for example, a microphone or a light source.

An opening 640 is formed in the housing 600 and is closed in a gas-tight manner by a molten sealing material 650. In the case of the housing 600 shown in FIG. 6, the opening 640 is formed in the housing cover 620. Alternatively, the opening 640 may also be formed in the housing body 610 (e.g. in the base plate 612). As has already been described above in conjunction with the production methods, it is possible for further openings to be formed in the housing 600, these each being closed in a gas-tight manner by a molten sealing material.

The housing 600 may provide a defined atmosphere for the semiconductor component 660. Accordingly, the semiconductor component 660 may be operated in defined surroundings.

As already indicated above, many applications for the housing 600 are possible. By way of example, the housing 600 can be used for photoacoustic gas sensors (on the detector side), since these have to be filled with a gas which is to be detected. That is to say, e.g., a CO2 sensor detector housing is filled with a CO2 gas. Similarly, the housing 600 can be used for an infrared (IR) emitter. By way of example, broadband emitters of the MEMS type contain thin resistors which are heated by current in order to emit IR light. This may be a high thermal load which is exerted on said resistor. The service life and quality can be improved by virtue of the fact that the emitter chip is placed into a cavity which is filled with protective gas (e.g. N2 or halogens). Other components may also profit from protective gas surroundings on account of the reduced susceptibility to corrosion. The use of gases with certain pressures or heat conductivity can generally improve the quality and service life of components under a high thermal load.

Aspects of the present documents therefore provide a method for filling, e.g., a ceramic cavity housing with a specific gas and for hermetically sealing the latter. To this end, the method comprises filling with gas after the attachment of the cover by evacuation and flooding with the required gas (through the via hole). Similarly, the method comprises sealing the via hole by virtue of a solder jetting process or the like (various options—see above).

The aspects and features which are described together with one or more of the previously detailed examples and figures may also be combined with one or more of the other examples, in order to replace an identical feature of the other example or in order to additionally introduce the feature into the other example.

Merely the principles of the disclosure are illustrated by the description and drawings. Furthermore, all examples presented here should in principle serve expressly only for teaching purposes, in order to assist the reader in understanding the principles of the disclosure and the concepts contributed by the inventor(s) for further developing the art. All statements herein regarding principles, aspects and examples of the disclosure as well as particular examples thereof are intended to encompass the equivalents thereof.

It goes without saying that the disclosure of multiple steps, processes, operations or functions disclosed in the description or the claims should not be interpreted as being in the specific order, provided that this is not specified explicitly or implicitly otherwise, e.g. for technical reasons. Therefore, these are not limited to a specific order by the disclosure of multiple steps or functions, unless these steps or functions are not exchangeable for technical reasons. Furthermore, in some examples, a single step, function, process or operation may include and/or be broken down into multiple sub-steps, sub-functions, sub-processes or sub-operations. Such sub-steps may be included and form part of the disclosure of this individual step, provided that they are not explicitly excluded.

Furthermore, the following claims are hereby incorporated in the detailed description, where each claim may represent a separate example by itself. While each claim may represent a separate example by itself, it should be noted that—even though in the claims a dependent claim may refer to a particular combination with one or more other claims—other examples may also include a combination of the dependent claim with the subject matter of any other dependent or independent claim. Such combinations are proposed explicitly here, provided that there is no indication that a specific combination is not intended. Furthermore, features of a claim are also intended to be included for any other independent claim, even if said claim is not made directly dependent on the independent claim.

What is claimed is:

1. A method for producing a hermetically sealed housing having a semiconductor component, the method comprising:
    attaching a housing cover to a housing body, of a housing, in a gas-tight manner to close off a cavity of the housing body, wherein the housing body or the housing cover has at least one opening, and wherein at least one semiconductor component is arranged in the cavity;
    introducing the housing with the housing cover into a process chamber;
    generating a vacuum in the cavity by evacuating the process chamber;
    generating a predetermined gas atmosphere in the cavity and the process chamber; and
    applying sealing material to the at least one opening while the predetermined gas atmosphere remains in the process chamber.

2. The method as claimed in claim 1, wherein the applying of the sealing material comprises applying a viscous sealing material to the at least one opening.

3. The method as claimed in claim 1, wherein the applying of the sealing material comprises spinning sealing material from a capillary onto the at least one opening.

4. The method as claimed in claim 1, wherein the applying of the sealing material comprises applying a sealing material in a molten state to the at least one opening.

5. The method as claimed in claim 1, wherein the applying of the sealing material causes a gas-tight closure of the at least one opening; and wherein, after the applying of the sealing material, no further supply of heat into the housing or the sealing material for the gas-tight closure of the at least one opening is effected.

6. The method as claimed in claim 1, further comprising: melting the sealing material to form molten sealing material, while the predetermined gas atmosphere remains in the process chamber, such that the molten sealing material closes the at least one opening in a gas-tight manner.

7. The method as claimed in claim 6, wherein the melting of the sealing material comprises heating a partial region of the housing, which surrounds the at least one opening, and also the sealing material.

8. The method as claimed in claim 6, wherein the melting of the sealing material comprises irradiating the sealing material with a laser beam.

9. The method as claimed in claim 1, wherein the at least one opening is metallized, and wherein the sealing material is a predetermined quantity of a metal alloy.

10. The method as claimed in claim 1, wherein the sealing material is a predetermined quantity of glass.

11. The method as claimed in claim 1, wherein the housing body is formed from ceramic, and wherein the housing cover is formed from ceramic, metal, or glass.

12. The method as claimed in claim 1, wherein the at least one semiconductor component is a microphone or a light source.

13. The method as claimed in claim 1, wherein the predetermined gas atmosphere is more than 75% by volume of carbon monoxide, carbon dioxide, methane, ethanol, nitrogen, or a halogen.

14. The method as claimed in claim 1, wherein a melting point of the sealing material is lower than a melting point of a part of the housing which surrounds the at least one opening.

15. The method as claimed in claim 1, wherein a melting point of the sealing material is above 200° C.

16. The method as claimed in claim 1, wherein a temperature of the predetermined gas atmosphere is between 15° C. and 30° C.

17. The method as claimed in claim 1, wherein a hydrostatic pressure of the predetermined gas atmosphere is between 0.5 bar and 3 bar.

18. The method as claimed in claim 1, wherein the at least one opening is formed in the housing cover or a base plate of the housing body.

19. A method for producing a hermetically sealed housing having a semiconductor component, the method comprising:
introducing a housing having a housing body and a housing cover into a process chamber, wherein the housing cover closes off a cavity of the housing body and is attached in a gas-tight manner to the housing body, wherein at least one opening is formed in the housing, and wherein at least one semiconductor component is arranged in the cavity;
generating a vacuum in the cavity by evacuating the process chamber;
generating a predetermined gas atmosphere in the cavity and the process chamber;
introducing sealing material into the at least one opening while the predetermined gas atmosphere remains in the process chamber; and
melting the sealing material to form molten sealing material, such that the molten sealing material closes the at least one opening in a gas-tight manner.

20. The method as claimed in claim 19, wherein the melting of the sealing material is effected under an air atmosphere.

21. The method as claimed in claim 19, wherein the introducing of the sealing material into the at least one opening comprises pressing a solid body, which includes the sealing material, into the at least one opening.

22. A method for producing a hermetically sealed housing having a semiconductor component, the method comprising:
providing a housing having a housing body and a housing cover, wherein the housing cover closes off a cavity of the housing body and is attached in a gas-tight manner to the housing body, wherein at least two openings are formed in the housing, and wherein at least one semiconductor component is arranged in the cavity;
guiding a gas flow through the cavity via the at least two openings, such that a predetermined gas atmosphere is formed in the cavity;
applying sealing material to the at least two openings; and
closing the at least two openings in a gas-tight manner based on applying the sealing material to the at least two openings.

23. A method for producing a hermetically sealed housing having a semiconductor component, the method comprising:
introducing a housing, having a sealed cavity and at least one semiconductor component arranged in the cavity, into a process chamber;
generating a vacuum in the cavity;
generating a predetermined gas atmosphere in the cavity and the process chamber; and
applying sealing material to at least one opening of the housing while the predetermined gas atmosphere remains in the process chamber.

24. The method of claim 23, wherein the predetermined gas atmosphere contains one or more predetermined gaseous media at a predetermined temperature and a predetermined gas pressure.

* * * * *